United States Patent
Talieh et al.

(10) Patent No.: US 6,497,800 B1
(45) Date of Patent: Dec. 24, 2002

(54) DEVICE PROVIDING ELECTRICAL CONTACT TO THE SURFACE OF A SEMICONDUCTOR WORKPIECE DURING METAL PLATING

(75) Inventors: Homayoun Talieh, San Jose, CA (US); Cyprian Uzoh, Milpitas, CA (US); Bulent M. Basol, Manhattan Beach, CA (US)

(73) Assignee: NuTool Inc., Milpitas, CA (US)

( * ) Notice: Subject to any disclaimer, the term of this patent is extended or adjusted under 35 U.S.C. 154(b) by 0 days.

(21) Appl. No.: 09/685,934

(22) Filed: Oct. 11, 2000

Related U.S. Application Data

(60) Provisional application No. 60/190,023, filed on Mar. 17, 2000.

(51) Int. Cl.$^7$ .............................................. C25D 17/00
(52) U.S. Cl. ............................. 204/224 R; 204/224 M; 204/279; 204/288.3
(58) Field of Search .............................. 204/279, 224 R, 204/224 M, 228.3

(56) References Cited

U.S. PATENT DOCUMENTS

| | | | |
|---|---|---|---|
| 3,328,273 A | | 6/1967 | Creutz et al. |
| 4,339,319 A | * | 7/1982 | Aigo ...................... 204/224 R |
| 4,430,173 A | | 2/1984 | Boudot et al. |
| 4,948,474 A | | 8/1990 | Miljkovic |
| 4,954,142 A | | 9/1990 | Carr et al. |

(List continued on next page.)

FOREIGN PATENT DOCUMENTS

| | | |
|---|---|---|
| WO | 98/27585 | 6/1998 |
| WO | WO 00/26443 | 5/2000 |

OTHER PUBLICATIONS

Robert D. Mikkola et al., "Investigation of the Roles of the Additive Components for Second Generation Copper Electroplating Chemistries Used for Advanced Interconnect Metalization", 2000 IEEE, IEEE Electron Devices Society pp. 117–119, Jun. 2000.

(List continued on next page.)

Primary Examiner—Donald R. Valentine
(74) Attorney, Agent, or Firm—Crowell & Moring LLP

(57) ABSTRACT

Substantially uniform deposition of conductive material on a surface of a substrate, which substrate includes a semiconductor wafer, from an electrolyte containing the conductive material can be provided by way of a particular device which includes first and second conductive elements. The first conductive element can have multiple electrical contacts, of identical or different configurations, or may be in the form of a conductive pad, and can contact or otherwise electrically interconnect with the substrate surface over substantially all of the substrate surface. Upon application of a potential between the first and second conductive elements while the electrolyte makes physical contact with the substrate surface and the second conductive element, the conductive material is deposited on the substrate surface. It is possible to reverse the polarity of the voltage applied between the anode and the cathode so that electro-etching of deposited conductive material can be performed.

18 Claims, 6 Drawing Sheets

U.S. PATENT DOCUMENTS

| | | |
|---|---|---|
| 4,975,159 A | 12/1990 | Dahms |
| 5,084,071 A | 1/1992 | Nenadic et al. |
| 5,256,565 A | 10/1993 | Bernhardt et al. |
| 5,354,490 A | 10/1994 | Yu et al. |
| 5,472,592 A | 12/1995 | Lowery |
| 5,516,412 A | 5/1996 | Andricacos et al. |
| 5,681,215 A | 10/1997 | Sherwood et al. |
| 5,755,859 A | 5/1998 | Brusic et al. |
| 5,762,544 A | 6/1998 | Zuniga et al. |
| 5,770,095 A | 6/1998 | Sasaki et al. |
| 5,773,364 A | 6/1998 | Farkas et al. |
| 5,793,272 A | 8/1998 | Burghartz et al. |
| 5,795,215 A | 8/1998 | Guthrie et al. |
| 5,807,165 A | 9/1998 | Uzoh et al. |
| 5,840,629 A | 11/1998 | Carpio |
| 5,858,813 A | 1/1999 | Scherber et al. |
| 5,884,990 A | 3/1999 | Burghartz et al. |
| 5,897,375 A | 4/1999 | Watts et al. |
| 5,911,619 A | 6/1999 | Uzoh et al. |
| 5,922,091 A | 7/1999 | Tsai et al. |
| 5,930,669 A | 7/1999 | Uzoh |
| 5,933,753 A | 8/1999 | Simon et al. |
| 5,954,997 A | 9/1999 | Kaufman et al. |
| 5,985,123 A | 11/1999 | Koon |
| 6,004,880 A | 12/1999 | Liu et al. |
| 6,027,631 A | 2/2000 | Broadbent |
| 6,063,506 A | 5/2000 | Andricacos et al. |
| 6,066,030 A | 5/2000 | Uzoh |
| 6,071,388 A | 6/2000 | Uzoh |
| 6,074,544 A | 6/2000 | Reid et al. |
| 6,103,085 A | 8/2000 | Woo et al. |
| 6,132,587 A | 10/2000 | Jorne et al. |
| 6,136,163 A | 10/2000 | Cheung et al. |
| 6,176,992 B1 | 1/2001 | Talieh |
| 6,187,152 B1 * | 2/2001 | Ting et al. ........... 204/224 M X |
| 6,228,231 B1 * | 5/2001 | Uzoh ..................... 204/224 R |
| 6,251,236 B1 * | 6/2001 | Stevens .................. 204/224 R |
| 6,334,937 B1 * | 1/2002 | Batz et al. .................. 204/212 |

OTHER PUBLICATIONS

James J. Kelly et al., "Leveling and Microstructural Effects of Additives for Copper Electrodeposition", Journal of the Electrochemical Society, 146 (7), 1999, pp. 2540–2545, (No Month).

Joseph M. Steigerwald et al., "Chemical Mechanical Planarization of Microelectronic Materials", A Wiley–Interscience Publication, 1997 by John Wiley & Sons, Inc. pp. 212–222.

Copies of Notification of Transmittal of International Preliminary Examination Report (2 pages), International Preliminary Examination Report (6pages), and annexes (amended sheets 22–30) in connection with PCT/US01/05552.

* cited by examiner-

DEVICE PROVIDING ELECTRICAL CONTACT TO THE SURFACE OF A SEMICONDUCTOR WORKPIECE DURING METAL PLATING

This application claims the priority of U.S. provisional application No. 60/190,023, filed Mar. 17, 2000, the disclosure of which is expressly incorporated by reference herein.

BACKGROUND OF THE INVENTION

Multi-level integrated circuit (IC) manufacturing requires many steps of metal and insulator film depositions followed by photoresist patterning and etching or other means of material removal. After photolithography and etching, the resulting wafer or substrate surface is non-planar and contains many features such as vias, lines or channels. Often, these features need to be filled with a specific material such as a metal or other conductor. Once filled with a conductor, the features provide the means to electrically interconnect various parts of the IC.

Electrodeposition is a technique used in IC manufacturing for the deposition of a highly conductive material, such as copper (Cu), into the features on the semiconductor wafer surface. FIG. 1 is a schematic illustration of a wafer or substrate 16 to be coated with Cu. Features 1 may be vias, trenches, bond pads, etc., and are opened in the dielectric or insulator layer 2. To achieve Cu deposition, a barrier layer 3 is first deposited over the whole wafer surface. Then, a conductive Cu seed layer 4 is deposited over the barrier layer 3. An electrical contact is made to the barrier layer 3 and/or the seed layer 4, the wafer surface is exposed to a Cu plating electrolyte, and a cathodic voltage is applied to the wafer surface with respect to an anode which also makes physical contact with the electrolyte. In this way, Cu is plated out of the electrolyte, onto the wafer surface, and into the features 1.

The terms "wafer" and "substrate" are used interchangeably above and throughout the remaining description. Referring to the example shown in FIG. 1, it is to be understood that the "wafer" or "substrate" referred to includes the wafer WF per se, the dielectric or insulator layer 2, and the barrier layer 3, with or without the seed layer 4. These terms, of course, may also refer to a wafer WF per se, including one or more previously processed layers, a further dielectric or insulator layer, and a further barrier layer, with or without a further seed layer.

The electrical contact to the seed layer and/or the barrier layer is typically made along the periphery of the wafer, which is usually round. This approach works well for thick and highly conductive seed layers and small wafer diameters (e.g. 200 mm) However, the trend in the semiconductor industry is to go to larger wafers (e.g. 300 mm) and smaller feature sizes (smaller than 0.18 microns). Smaller feature sizes, as well as cost considerations, require the use of the thinnest possible seed layers. As the wafer size increases, the plating current value also increases. As the seed layer thickness decreases, the sheet resistance increases, and the voltage drop between the middle and the edge of a large wafer also increases. Therefore, voltage drop becomes a major problem, especially for large wafers with thin seed layers. This voltage drop results in non-uniform Cu deposition on the wafer surface, the regions near the contacts being typically thicker than other regions.

One other consideration in Cu plating is the "edge exclusion". Cu plating heads, such as the one described in commonly assigned, copending application Ser. No. 09/472,523, filed Dec. 27, 1999, titled WORK PIECE CARRIER HEAD FOR PLATING AND POLISHING, typically use contacts around peripheries of the wafers. Making electrical contact and, at the same time, providing a seal against possible electrolyte leakage is difficult.

FIG. 1a shows a cross sectional view of a contacting scheme in which the wafer or substrate 16 is contacted by a ring-shaped contact 17 which is sealed by a ring seal 18 against exposure to the electrolyte 9a. The seal 18 also prevents the electrolyte 9a from reaching the back surface of the wafer or substrate 16. Such a contacting scheme extends a distance "W" from the edge of the wafer. The distance "W" is referred to as "edge exclusion" and may typically be 3–7 mm. Minimizing "W" would allow better utilization of the wafer surface for IC fabrication.

There is, therefore, a need to develop new and novel approaches to provide electrical contacts to the surface of semiconductor wafers during electrodeposition of conductors.

SUMMARY OF THE INVENTION

It is a primary object of this invention to provide both a device and a method by which substantially uniform deposition of conductive material on a surface of a substrate, which includes a semiconductor wafer, from an electrolyte containing the conductive material is made possible. According to the invention, a first conductive element can contact or otherwise electrically interconnect with the substrate surface at locations disposed over substantially all of the surface. Upon application of a potential between the first conductive element and a second conductive element, while the electrolyte makes physical contact with the surface and the second conductive element, the conductive material is deposited on the surface.

In one preferred form of the invention, the first conductive element is provided with multiple electrical contacts. The multiple electrical contacts may include pins extending from the first conductive element, rollers biased and electrically interconnected, at least in part, by springs with the first conductive element, or various combinations of such pin and spring biased roller contacts. In this form of the invention, the first conductive element is a cathode plate, and the second conductive element is an anode plate. Each pin or spring biased roller contact extends through a hole provided in the second conductive element, and an insulator is interposed between the pin or the spring biased roller contact and the second conductive element. The electrical contacts are biased into contact or at least into electrical connection with the substrate surface. The device also includes a pad disposed on the second conductive element by which the substrate surface can be polished. At least one of the substrate and the second conductive element can be moved relative to the other while the conductive material is deposited on the surface of the substrate. This relative movement may be in the form of rotation and/or translation. If pins are used as the electrical contacts, each pin may have a rounded tip adapted to contact the substrate surface.

In another preferred form of the invention, the first conductive element can be a conductive pad through which the electrolyte can flow, and the second conductive element can be an anode plate separated by an insulating spacer from the conductive pad. At least one of the substrate and the pad can be rotated or translated relative to the other while the conductive material is deposited on the surface of the substrate, and in this way the substrate surface can be polished by the pad.

The device can also be used to provide substantially uniform electro-etching of conductive material deposited on the substrate surface when the polarity of the potential applied is reversed. Moreover, the device can be used simply to provide substantially uniform electro-etching of conductive material on the substrate surface. In this case, a first conductive element can be electrically interconnected with the substrate surface over substantially all of the surface. Upon application of a potential between the first and second conductive elements while an electrolyte makes physical contact with the surface of the substrate and the second conductive element, the conductive material on the surface will be etched.

Other features and advantages of the invention will become apparent from the description which follows.

DESCRIPTION OF THE PREFERRED EMBODIMENTS

The following is a description of novel approaches to make distributed multiple electrical contact to the wafer surface, all over the surface, rather than just at the periphery. Various approaches are described.

Figure 2:
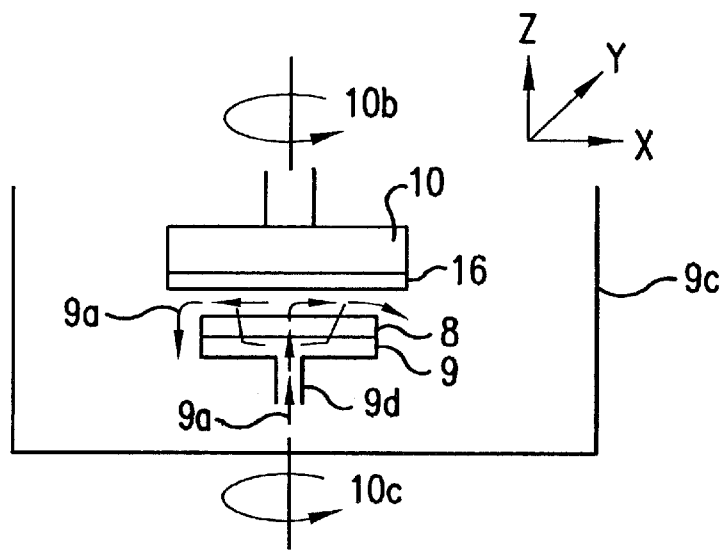
FIG. 2 is a schematic illustration of an apparatus in which the present invention may be utilized.

A general depiction of one version of a plating apparatus is shown in FIG. 2. This apparatus can also be used for plating and polishing as disclosed in commonly assigned application Ser. No. 09/201,929, filed Dec. 1, 1998, titled METHOD AND APPARATUS FOR ELECTROCHEMICAL MECHANICAL DEPOSITION, now U.S. Pat. No. 6,176,992, and commonly assigned, copending application Ser. No. 09/472,523, filed Dec. 27, 1999, titled WORK PIECE CARRIER HEAD FOR PLATING AND POLISHING. The carrier head 10 holds the wafer 16. The wafer has the barrier layer and the seed layer (not shown in FIG. 2) deposited on its surface, and therefore its surface is conductive. The head can be rotated around a first axis 10b. It can also be moved in the x, y, and z directions. A pad 8 is placed on an anode plate 9 across from the wafer surface. The pad surface may itself be abrasive, or the pad may contain an abrasive material. Pad designs and structures form the subject matter of commonly assigned, copending application Ser. No. 09/511,278, filed Feb. 23, 2000, titled PAD DESIGNS AND STRUCTURES FOR A VERSATILE MATERIALS PROCESSING APPARATUS, now U.S. Pat. No. 6,413,388, and commonly assigned, copending application Ser. No. 09/621,969, filed Jul. 21, 2000, now U.S. Pat. No. 6,413,403, titled PAD DESIGNS AND STRUCTURES WITH IMPROVED FLUID DISTRIBUTION.

Electrolyte 9a is supplied to the wafer surface through the openings in the anode plate and the pad as shown by the arrows in FIG. 2. Commonly assigned, copending application Ser. No. 09/568,584, filed May 11, 2000, titled ANODE ASSEMBLY FOR PLATING AND PLANARIZING A CONDUCTIVE LAYER, discloses an anode plate, while commonly assigned, copending application Ser. No. 09/544,558, filed Apr. 6, 2000, now U.S. Pat. No. 6,354,916, titled MODIFIED PLATING SOLUTION FOR PLATING AND PLANARIZATION, the disclosure of which is incorporated by reference herein as non-essential material, discloses an electrolyte. The electrolyte then flows over the edges of the pad into the chamber 9c to be re-circulated after cleaning/filtering/refurbishing. An electrical contact 9d is provided to the anode plate. The anode plate turns around the axis 10c. In some applications, the plate may also be translated in the x, y, and/or z directions. Axes 10b and 10c are substantially parallel to each other. The diameter of the pad 8 is typically smaller than the diameter of the wafer surface exposed to the pad surface, although it may also be larger. The gap between the wafer surface and the pad is adjustable by moving the carrier head and/or the anode plate in the z direction. In one mode of operation, the workpiece (i.e., the wafer or substrate) may be brought close to the pad, without touching the pad. In this mode, during material deposition, the workpiece hydroplanes or floats over the pad or anode. In another mode of operation, the wafer surface and the pad may be in contact. When the wafer surface and the pad are touching, the pressure that is exerted on the wafer and pad surfaces can also be adjusted.

Figure 1:
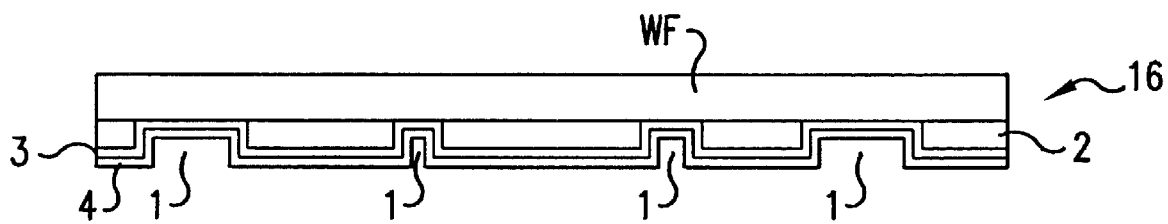
FIG. 1 is an illustration of the known structure of a wafer or substrate to be coated with Cu.
Figure 3:
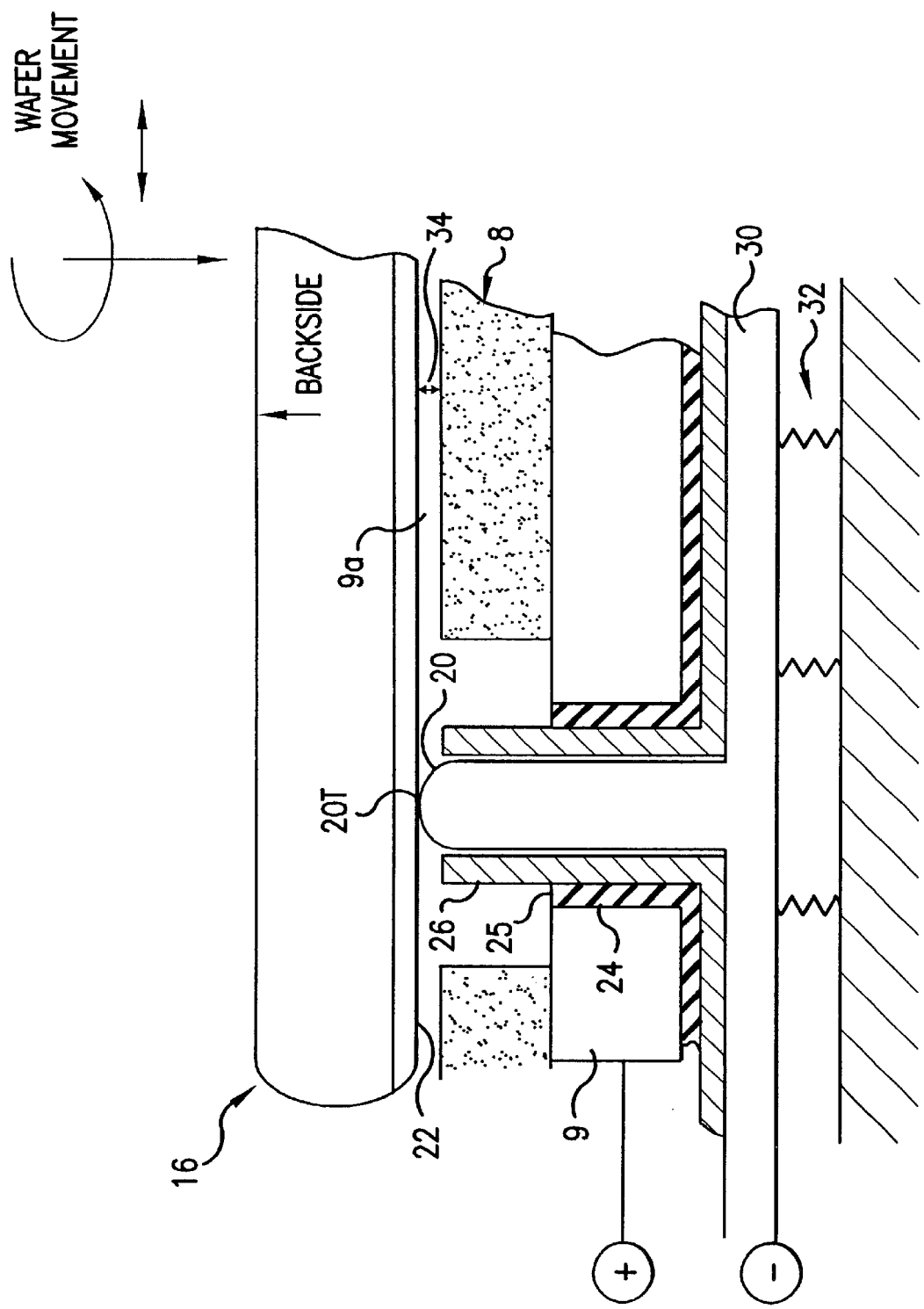
FIG. 3 shows one electrical contact embodiment in a device forming the subject matter of the present invention.

According to a first embodiment of the invention, electrical connection to the wafer surface is made by way of multiple electrical contacts formed by pins that come up through the pad 8 and touch the wafer surface. Assuming by way of example that it is the structure shown in FIG. 1 that is to be plated, and referring now to FIG. 3, it will be understood that the wafer surface 22 is formed by the exposed surface of the seed layer 4. A magnified view of one of the multiple electrical contacts is shown in FIG. 3. Holes 24 have been provided in the anode plate 9 to accommodate the pins 20. These pins 20 are electrically isolated from the anode plate 9 by an insulator 26. The insulator may be a ceramic or other appropriate dielectric material. A seal 25 is interposed between the anode plate 9 and the insulator 26. The pins 20 forming the electrical contacts are an integral part of a cathode plate 30, which is also electrically isolated from the anode plate 9 by the insulator 26. The cathode plate 30 is spring loaded by suitable springs 32 which bias or push the rounded tips 20T of the pins 20 towards the wafer surface 22 during the plating operation. Thus, the electrical contacts can slide up under the spring bias and down against the spring bias to adjust dynamically to the carrier head or workpiece location relative to the anode plate.

A roller ball, similar to that which could be used in a ball-point pen, can be incorporated at the tips 20T to prevent scratching the wafer surface. Various additional or alternative electrical contact configurations will be described in connection with FIGS. 7–12. Soft conductive brushes can also be used to make contact to the wafer surface. It is important that the selected contacts do not scratch the wafer surface excessively.

For plating, the electrolyte 9a is supplied to the gap 34 between the pad 8 and the wafer surface 22 and thus is brought into physical contact with the wafer surface and the anode plate. In one mode of operation, the wafer 16 is brought down until its surface 22 makes physical contact to the tips 20T of the pins 20. A potential is applied between the cathode plate 30 and the anode plate 9, making the cathode plate 30 more negative than the anode plate 9. Therefore, the wafer surface is also rendered cathodic through the pins 20. Under applied potential, copper plates out of the electrolyte 9a onto the wafer surface 22. By adjusting the gap 34 between the pad 8 and the wafer surface 22 and/or by adjusting the pressure with which the pad 8 and the wafer surface 22 touch each other, one can achieve just plating, or plating and polishing. For effective polishing it is preferred that the pad 8 have an abrasive surface or that the whole pad 8 is abrasive.

During plating, the wafer or substrate 16 and the anode plate/pad assembly 8, 9 should rotate with respect to one another so that plating takes place uniformly. They may also translate in one or two directions. The electrolyte 9a typically fills any gap 34 between the pad 8 and the wafer surface 22. It is most preferable that the electrolyte 9a be applied through channels in the anode plate 9 and the pad 8 (not shown in FIG. 3). Alternately, if the gap 34 is large (e.g. 2 mm or larger), the electrolyte can be provided into the gap 34 from the edges of the wafer.

In other applications, the pin tips 20T, or the tips of other types of electrical contacts which will be described, may be disposed in close proximity to the wafer surface 22 without touching this surface. Moreover, under a potential applied between the wafer and the anode plate, copper may be either plated onto or removed from the wafer, depending on the polarity of the wafer. Circuitry used for application and adjustment of the applied potential, and for inverting the polarity of the potential, is well known and commonly used.

Figure 4:
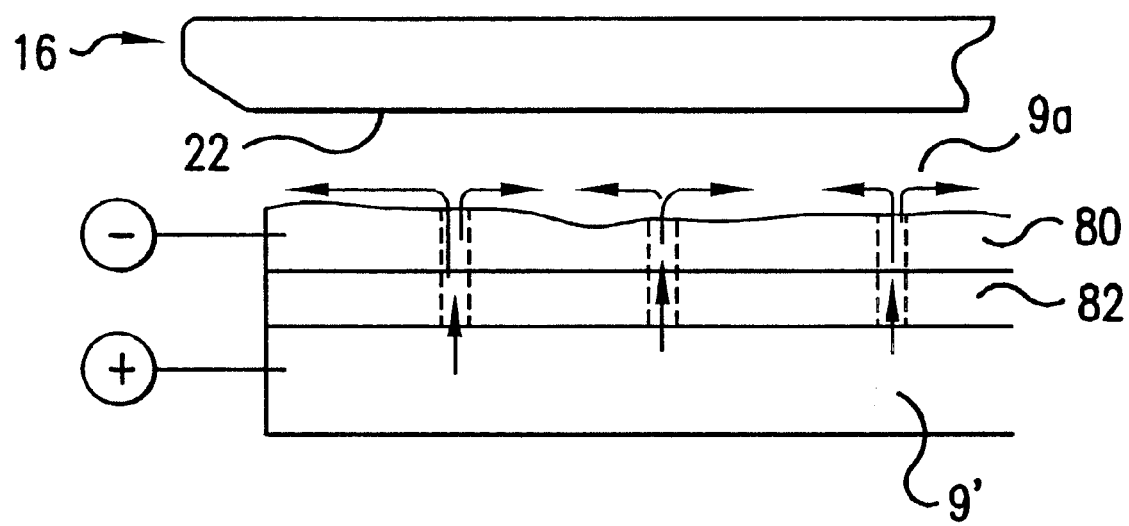
FIG. 4 shows another electrical contact embodiment.

In the construction shown in FIG. 4, electrical contact to the wafer surface is made by way of a potential conductive pad 80. This pad 80 is used in place of the multiple pins 20. In this case, an insulating spacer 82 of ceramic or other dielectric material is placed directly over the anode plate 9' between the anode plate 9' and the conductive pad 80. Electrical supply contacts are made to the conductive pad 80 and the anode plate 9', and a cathodic potential is applied to the pad 80, with electrolyte 9a making physical contact to the anode plate 9', the pad 80 and the wafer surface 22. When the substrate or wafer 16 is brought down and engages the pad, it gets energized and Cu plating on the wafer surface 22 commences. The construction shown in FIG. 4 is similar to certain pad designs and structures forming the subject matter of application Ser. No. 09/511,278, filed Feb. 23, 2000, mentioned previously. Additionally, commonly assigned application Ser. No. 09/483,095, filed Jan. 14, 2000, titled SEMICONDUCTOR WORKPIECE PROXIMITY PLATING METHODS AND APPARATUS, discloses conductive pad strips used on cylindrical anodes. In other applications, the potential conductive pad 80 may be allowed to float with respect to the wafer surface 22 during material deposition or removal. The potential, moreover, may be pulsed to produce impulse plating. Again, the circuitry used for pulsing the potential is well known and commonly used.

In both approaches described above and in others which will be described, some Cu plating may take place on the exposed cathodic surfaces besides the wafer surface. In the case of pins, for example, exposed regions of the pins may get coated. In case of a conductive pad, the whole pad may get coated. Therefore, it is of utmost importance to select the right conductive materials to be used for the construction of the electrical contacts and the pads. The materials should be such that plating on the Cu coated wafer surface (i.e. the seed layer 4 of FIG. 1) should be preferable or more efficient than plating on the pad or contact surface. Examples of proper materials for the pads may be various conductive polymers or polymeric materials that are coated with refractory metals such as Ta, alpha Ta, W, Mo or their nitrides. The pins or other electrical contacts can be made of conductive polymers or refractory metals such as Mo, Ta and W; alternatively, the pins or other cathode contacts can be made of any conductive metal such as Cu or Ni, or of a conductive alloy such as Cu—Be, Cu—Ag, Ag—Pt, etc., but these metals or alloys may be coated by a refractory metal or compound and/or a nitride of a refractory metal, such as TaN or TiN, or of a refractory compound. These are just some examples. There are many more materials on which Cu does not deposit efficiently.

Figure 1A:
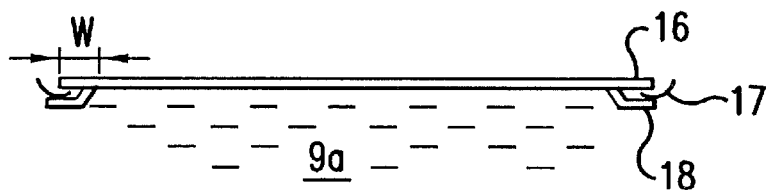
FIG. 1a is a cross sectional side view of a wafer or substrate contacting scheme.
Figure 5:
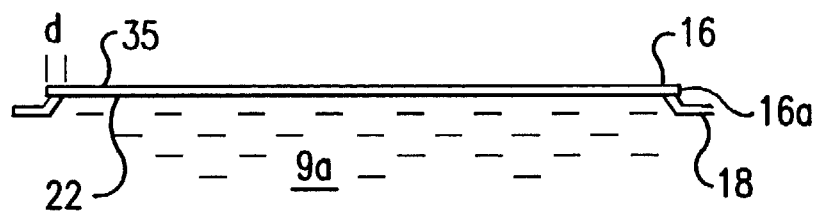
FIG. 5 is a cross sectional side view similar to FIG. 1a but showing a reduction in wafer edge exclusion made possible by the invention.

By employing this invention, the "edge exclusion" discussed earlier in connection with FIG. 1a can be reduced on the wafer. As shown in FIG. 5, eliminating the need for a contact ring to contact the periphery of the wafer permits a reduction of the edge exclusion "d". The seal 18 can be either on the surface 22 of the wafer 16 facing the electrolyte 9a or right at the edge 16a of the wafer. The seal 18 may even be disposed on the surface 35 of the wafer 16 facing away from the electrolyte 9a.

Figure 6A:
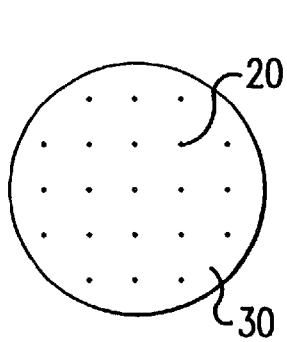
FIGS. 6a, 6b, and 6c show various individual electrical contact distributions.
Figure 6B:
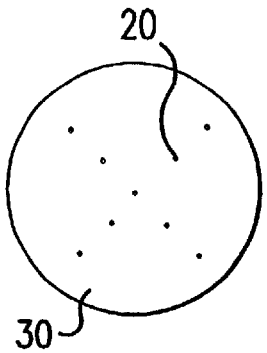
Figure 6C:
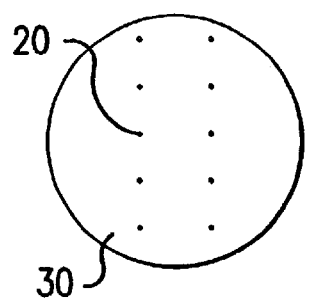

Various electrical contact distributions may be used. FIGS. 6a–6c schematically show three possible types of distribution of pins 20 over a cathode plate 30. As a rule, as the number of electrical contacts increases, the voltage drop from the center to the edge of the wafer will become smaller, and the thickness of the plated metal becomes more uniform.

Thus far, the invention has been described using Cu as the plated metal. However, practically any metal or conductive alloy can be plated on a wafer/substrate surface using this invention.

Although the invention has been described with reference to an electroplating technique and apparatus, it is also directly applicable to electroetching and/or electro-polishing techniques and apparatus. In this case, the polarity of the voltage applied between the anode and cathode plates is reversed, making the substrate surface more positive. An electro-etching electrolyte may be used. Again, the circuitry used for application and adjustment of the voltage, and for inversion of the voltage polarity, is well known and commonly used.

Figure 7:
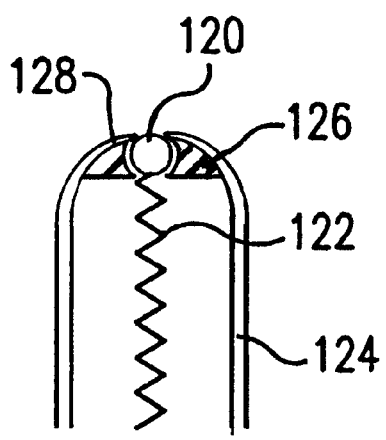
FIG. 7 shows another electrical contact embodiment.

FIG. 7 shows one of a plurality of electrical contacts which may be used as alternatives to, or together with, pins such as the pins 20, or together with other electrical contact configurations, to provide the necessary electrical connection to a wafer surface. FIGS. 8–10 and 12 also show additional electrical contact configurations which can be used as alternatives to, or together with, other contact configurations. Each electrical contact of FIG. 7 includes a conductive roller 120, which is preferably spherical in geometry. Rollers having other suitable geometrical shapes, such as cylindrical rollers, may be used. The rollers are preferably coated with a corrosion resistant material such as gold, platinum, pallidum, their alloys, or some other appropriate contact alloy material.

The roller 120 may be housed in an arrangement that may include, but is not limited to, a contact spring 122 to supply electrical power from the cathode plate (not shown) to the roller 120. The end of the spring 122 also acts as a bearing surface. The spring 122 allows for a gentle but dynamic loading of the roller 120 on the surface of the workpiece. Each spring 122 biases its respective roller toward the wafer surface. In the embodiment shown in FIG. 7, the electrical contact per se is formed by the roller 120 and the spring 122 which supports the roller. Each spring 122 extends between the cathode plate (not shown in FIG. 7), on which the spring is supported in any appropriate fashion, and the roller 120 supported by the spring. Both the spring 122 and the roller 120 are surrounded by an insulator 124 of a ceramic or other appropriate dielectric material that isolates the spring 122 and the roller 120 from an electric field during the process of plating Cu out of the electrolyte. The insulator 124 may be configured similarly to the insulator 26, represented in FIG. 1, but can include a shaped tip 128. The shaped tip 128 and a seal 126 are disposed around the roller 120. The seal 126 may be adhesively or otherwise secured to the inner surface of the shaped tip.

Figure 11:
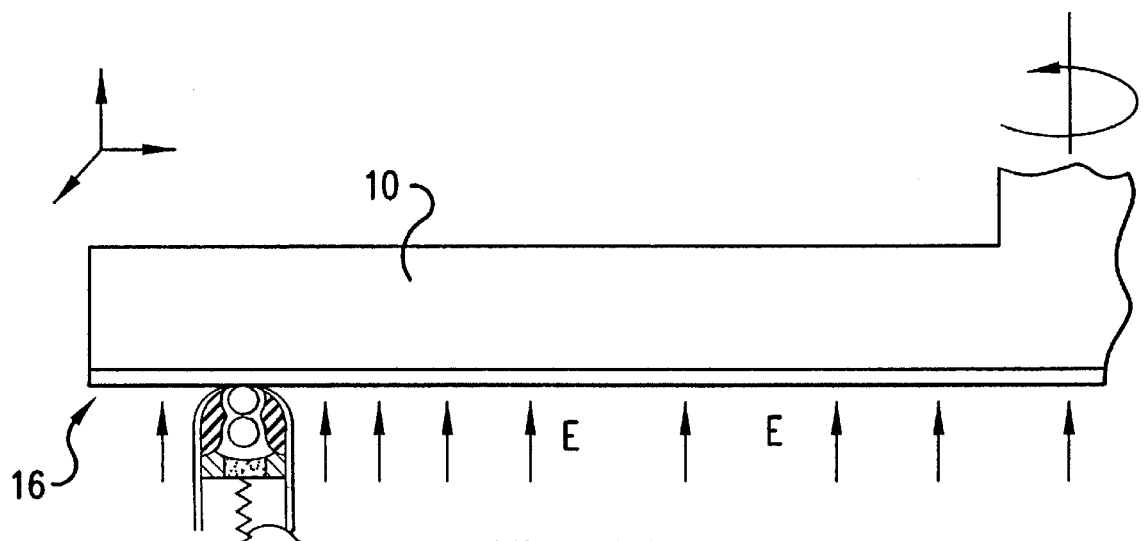
FIG. 11 is a schematic illustration of a single electrical contact such as that shown in FIG. 10 while in contact with a wafer surface during application of an electric field.

The seal arrangement is such that the roller 120 rotates freely with respect to the seal 126. The electrolyte fluid boundary layer, and, if the electrolyte forming the subject matter of copending application Ser. No. 09/544,558 mentioned above is used, especially the additive in the electrolyte, helps lubricate the roller surface. In addition to housing the roller 120 and the seal 126, the tip 128 also prevents the roller 120 from exposure to the electric field. FIG. 11, which shows one electrical contact according to another embodiment in use, indicates an applied electric field by reference characters E. Consequently, the tip and seal configuration helps prevent or minimize material deposition on the roller 120.

Figure 8:
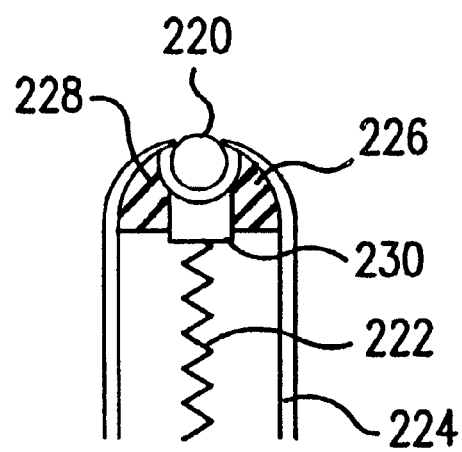
FIG. 8 shows a further electrical contact embodiment.

FIG. 8 shows another embodiment in which a rolling pad 230 of conducting material (e.g. metal), preferably with a partially spherical shaped surface, is disposed between the contact spring 222 and a spherical roller 220. The roller 220 rests on the shaped rolling pad 230. The shaped tip 228 and the seal 226 cooperate with the spring biased rolling pad 230 to confine the roller 220 while allowing it to rotate freely along any direction. In a manner similar to the roller 120 of FIG. 7, the roller 220 protrudes partly through but is restrained by the perimeter of an end opening in the insulator 224 which surrounds the seal 226, the spring 222, and the rolling pad 230. In the embodiment shown in FIG. 8, therefore, the electrical contact per se is formed by the roller 220, the spring 222, and the spring biased rolling pad 230 disposed between the roller and the spring.

Figure 9:
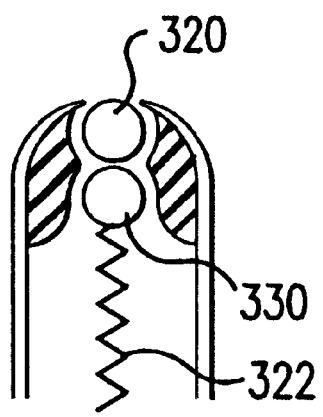
FIG. 9 shows still another electrical contact embodiment.

FIG. 9 shows that a conductive roller 320 may rest on a support member 330 having, for example, a spherical supporting surface rather than on a rolling pad. Multiple support members could be used beneath the roller 320. Such an arrangement is ideal for self-aligned roller contact. In the embodiment shown in FIG. 9, the electrical contact per se is formed by the roller 320, the spring 322, and the support member 330.

Besides the advantage of self alignment, the rolling fiction between the roller 320 and the substrate or workpiece is greatly reduced, especially when the workpiece rotates or translates during the process of plating Cu out of the electrolyte. The reduced friction minimizes undesirable workpiece scratching and damage as well as particulate generation.

Figure 10:
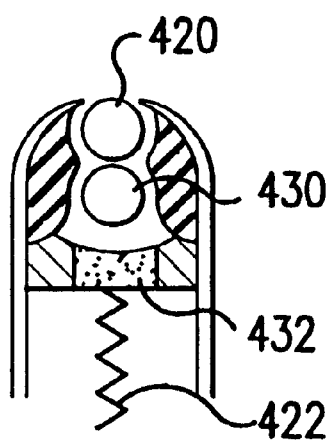
FIG. 10 shows one more electrical contact embodiment.
Figure 12:
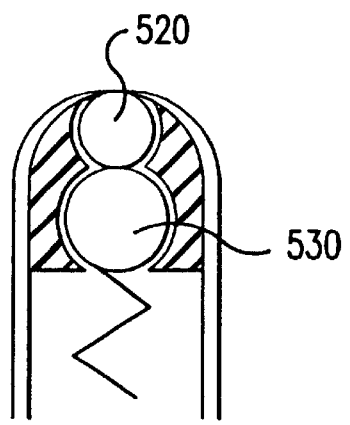
FIG. 12 shows part of another electrical contact embodiment which is similar to those of FIGS. 9 and 10 but in which a roller and a roller support member have different sizes.

Other suitable support member geometries could also be used. For instance the cross section of the support member may be triangular, or the roller support may rest on the knife edge of a support member. In another embodiment, shown in FIG. 10, a spherical support 430 is disposed between a conductive roller pad 432 and the roller 420. In FIG. 10, the electrical contact per se is formed by the roller 420, the conductive spring 422, the conductive spherical support 430, and the spring biased and conductive rolling pad 432. FIG. 11 shows the embodiment of FIG. 10 in use during conductive material deposition. Also, as shown in FIG. 12, the size of the roller 520 may be different from that of the roller support member 530.

It is important that the roller material, the contact spring material, and the like do not degrade or dissolve in the electrolyte of interest. It is also desirable that these materials do not degrade the quality of the material deposited. The roller, for example, must not excessively scratch the deposited film or generate very undesirable particulates. Numerous face contacts may be made around the periphery of the wafer. The individual contacts may be discrete and range from 4 to about 2000 in number, depending on size of the substrate. As the size of the wafer or substrate increases, the number of electrical contacts used should also increase. The roller contacts could also be a continuous race track or a track which is split into several elements. For example, the periphery may be divided into quadrants or octets. Each quadrant, etc., may contain many more or less uniformly dispersed roller contacts or contact tips.

Finally, although the invention is described with reference to an electroplating technique and apparatus, it is directly applicable to an electro-etching or electro-polishing technique or apparatus. In this case, the polarity of the voltage applied between the anode and cathode plates is reversed, making the substrate surface more positive. A special electro-etching electrolyte also could be used.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

We claim:

1. A device for depositing a conductive material, on the whole surface of a substrate, from an electrolyte that contains the conductive material comprising:
   at least one electrical contact for electrically connecting the surface to a power source, wherein the contact and the surface are electrically connected and adapted for relative motion therebetween; and
   an electrode connected to the power source, wherein upon application of a potential between the contact and the electrode while relative motion and an electrical connection between the contact and the surface that is moving are maintained and while the electrolyte makes physical contact with the surface and the electrode, the conductive material is deposited on the surface.

2. The device of claim 1, further comprising a pad positioned between the surface and the electrode and in close proximity to the surface.

3. The device of claim 1, wherein the surface slidably touches said electrical contact.

4. A device for depositing a conductive material, on the whole surface of a substrate, from an electrolyte that contains the conductive material comprising:
   at least one electrical contact for electrically connecting the surface to a power source, wherein the contact and the surface are electrically connected and adapted for relative motion therebetween;

an electrode connected to the power source, wherein upon application of a potential between the contact and the electrode while the electrolyte makes physical contact with the surface and the electrode, the conductive material is deposited on the surface; and a pad positioned between the surface and the electrode and in close proximity to the surface;

wherein the pad has openings through which the electrolyte can flow and reach the surface of the substrate.

5. The device of claim 4, wherein deposition of the conductive material on the surface occurs during relative movement between the pad and the substrate.

6. The device of claim 5, wherein deposition of the conductive material occurs while the substrate and the pad contact each other.

7. The device of claim 6, wherein the electrical contact is a pin.

8. The device of claim 7, wherein the pin has a rounded tip adapted to contact the surface.

9. The device of claim 6, wherein the electrical contact has at least one roller at its tip to contact the surface, and wherein the at least one roller is biased toward the surface.

10. A device for uniformly removing a layer of conductive material, off the surface of a substrate, using an electrolyte solution, comprising:

at least one electrical contact for electrically connecting the surface to a power source, wherein the contact and the surface are electrically connected and adapted for relative motion therebetween; and an electrode connected to the power source, wherein upon application of a potential between the contact and the electrode while relative motion and an electrical connection between the contact and the surface that is moving are maintained and while the electrolyte makes physical contact with the surface and the electrode, the conductive material is removed from the surface.

11. The device of claim 10, wherein the surface slidably touches said electrical contact.

12. A device for uniformly removing a layer of conductive material, off the surface of a substrate, using an electrolyte solution, comprising:

an electrical contact for electrically connecting the surface to a power source, wherein the contact and the surface are electrically connected and adapted for relative motion therebetween;

an electrode connected to the power source, wherein upon application of a potential between the contact and the electrode while the electrolyte makes physical contact with the surface and the electrode, the conductive material is removed from the surface; and a pad positioned between the surface and the electrode and in close proximity to the surface.

13. A device for uniformly removing a layer of conductive material, off the surface of a substrate, using an electrolyte solution, comprising:

at least one electrical contact for electrically connecting the surface to a power source, wherein the contact is stationary and the surface is electrically connected with and slidable with respect to the electrical contacts;

an electrode connected to the power source, wherein upon application of a potential between the contact and the electrode while the electrolyte makes physical contact with the surface and the electrode, the conductive material is removed from the surface; and a pad positioned between the surface and the electrode and in close proximity to the surface;

wherein the pad has openings through which the electrolyte can flow and reach the surface of the substrate.

14. The device of claim 13, wherein removal of the conductive material from the surface occurs during relative movement between the pad and the substrate.

15. The device of claim 14, wherein removal of the conductive material occurs while the substrate and the pad contact each other.

16. The device of claim 15, wherein the electrical contact is a pin.

17. The device of claim 16, wherein the pin has a rounded tip adapted to contact the surface.

18. The device of claim 15, wherein the electrical contact has at least one roller at its tip to contact the surface, and wherein the at least one roller is biased toward the surface.

* * * * *